United States Patent [19]
Wen et al.

[11] Patent Number: 6,083,802
[45] Date of Patent: Jul. 4, 2000

[54] METHOD FOR FORMING AN INDUCTOR

[75] Inventors: Wen Ying Wen; Shing Shing Chiang, both of Hsinchu, Taiwan

[73] Assignee: Winbond Electronics Corporation, Taiwan

[21] Appl. No.: 09/223,840

[22] Filed: Dec. 31, 1998

[51] Int. Cl.⁷ .................................................. H01L 21/20
[52] U.S. Cl. ........................................... 438/381; 438/406
[58] Field of Search ...................... 438/238, 381, 438/329, 406, 459; 257/531, 374, 396

[56] References Cited

U.S. PATENT DOCUMENTS

| | | |
|---|---|---|
| 5,384,274 | 1/1995 | Kanehachi . |
| 5,742,091 | 4/1998 | Hebert ........................................ 257/531 |
| 5,807,783 | 9/1998 | Gaul et al. ................................. 438/406 |

*Primary Examiner*—David Nelms
*Assistant Examiner*—David Nhu
*Attorney, Agent, or Firm*—Finnegan, Henderson, Farabow, Garrett & Dunner, L.L.P.

[57] ABSTRACT

A method for forming an inductor in a semiconductor substrate having a trench therein including the steps of forming a first metal portion in the trench, providing a flowable dielectric material in the trench, depositing a layer of dielectric material over the layer of first metal portion and flowable dielectric material, forming a plug in the layer of dielectric material wherein the plug is in electrical contact with the first metal portion, and forming a second metal portion over the layer of dielectric material wherein the second metal portion is in electrical contact with the plug.

20 Claims, 6 Drawing Sheets

METHOD FOR FORMING AN INDUCTOR

BACKGROUND OF THE INVENTION

1. Field of the Invention

This invention pertains in general to a method of forming an inductor in an integrated circuit and, more particularly, to a method of forming an inductor substantially recessed in the substrate of the integrated circuit.

2. Description of the Related Art

Coupling or interference between devices in an integrated circuit poses a great concern as the size of the circuit is scaled down. In high frequency technology applications such as in telecommunications, inductors are used to reduce coupling among devices. However, the advantage gained by forming an inductor in an integrated circuit is often offset by the disadvantages associated with the manufacturing process to form the inductor. Specifically, the layered formation of an inductor coil in the manufacturing process requires the repeated use of chemical mechanical polishing ("CMP"), an inherently "dirty" process in semiconductor parlance.

SUMMARY OF THE INVENTION

Accordingly, the present invention is directed to a method of forming an inductor in a semiconductor device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims hereof, as well as the appended drawings.

To achieve these and other advantages, and in accordance with the purpose of the invention as embodied and broadly described, there is provided a method for forming an inductor in a semiconductor substrate having a trench therein that includes the steps of forming a metal portion in the trench, providing a flowable dielectric material in the trench to fill a space between the first metal portion and a wall of the trench such that the layer of first metal portion and flowable dielectric material is substantially planar, and depositing a layer of dielectric material over the layer of first metal portion and flowable dielectric material. The method also includes the steps of forming a plug in the layer of dielectric material wherein the plug is in electrical contact with the first metal portion, and forming a second metal portion over the layer of dielectric material wherein the second metal portion is in electrical contact with the plug.

In one aspect of the invention, the step of forming a first metal portion includes the steps of depositing a layer of metal in the trench, patterning and defining the layer of metal, and etching the layer of metal to form a metal portion.

In another aspect, the step of providing a flowable dielectric material comprises a step of providing a spin-on glass.

In yet another aspect, the method further includes a step of etching back the layer of first metal portions and flowable dielectric material.

In still another aspect, the step of forming a plug includes the steps of patterning and defining the layer of dielectric material, etching the layer of dielectric material to define an opening such that the opening is aligned with the first metal portion, and providing a metallic material in the opening.

Also in accordance with the invention, there is provided a method for forming an inductor in a substrate of a semiconductor device including at least one active device that includes the steps of forming a trench in the substrate, forming a first layer of dielectric material over the substrate and inside the trench, forming a first plurality of metal portions in the trench, and providing a flowable dielectric material in the trench to fill the spaces among the first plurality of metal portions such that the layer of first metal portions and flowable dielectric material is substantially planar. The method also includes the steps of depositing a second layer of dielectric material over the layer of first metal portions and flowable dielectric material, forming a plurality of plugs in the second layer of dielectric material wherein each of the plurality of plugs is in electrical contact with one of the first plurality of metal portions, and forming a second plurality of metal portions over the second layer of dielectric material wherein each of the second plurality of metal portions is in electrical contact with one of the plugs.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

The present invention is directed to a method of forming an inductor wherein substantially all of the inductor coil is recessed in the device substrate. By forming a substantially recessed inductor, the use of the CMP process is minimized. A method in accordance with the present invention is explained with reference to FIGS. 1–13. Although FIGS. 1–13 show the formation of only one inductor, the figures are for illustrative purposes only and should not be construed to limit the application of the present invention.

Figure 1:
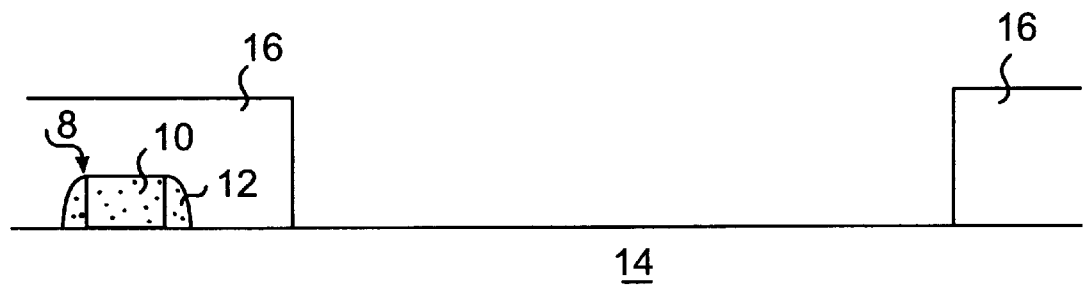
FIGS. 1–13 show a cross-sectional view of the formation of an inductor in accordance with the method of the present invention.

In one method, the process of forming a substantially recessed inductor begins after active devices such as transistors have already been formed. FIG. 1 shows a transistor 8 having a gate 10 and oxide spacers 12 formed over a substrate 14. Transistor 8 also has spaced-apart regions, i.e., source and drain regions (not shown), in substrate 14 beneath spacers 12 and a channel region (not shown) between the spaced-apart regions. Although FIG. 1 shows only one active device, additional devices and field oxides will have been formed. A photoresist 16 is deposited over transistor 8 and substrate 14. The area of photoresist 16 over which a trench is to be formed is opened. The exposed substrate 14 is etched with an etchant, for example, a fluorine-based etchant, to form a trench.

Figure 2:
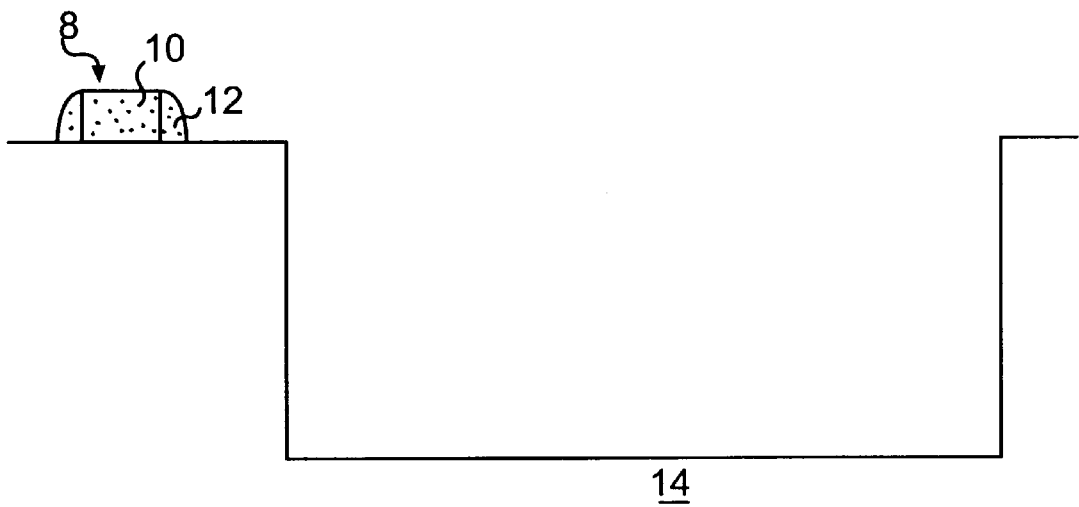
Figure 3:
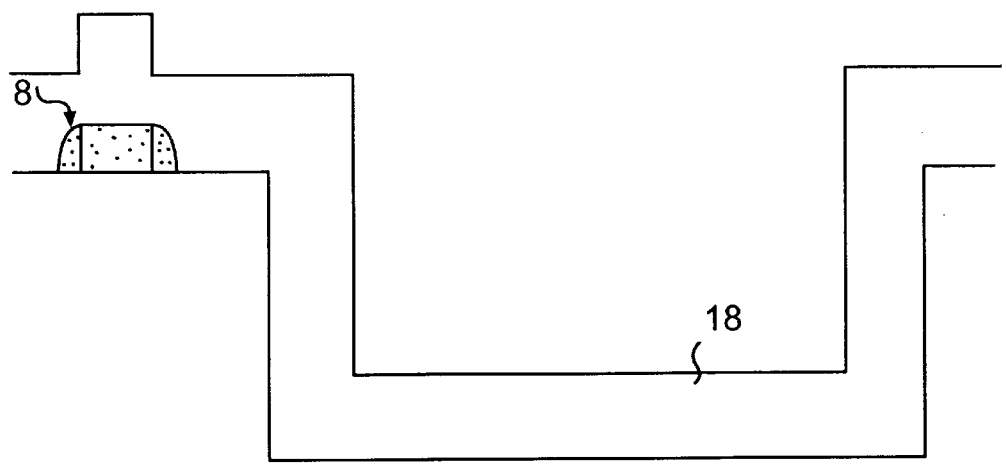

Referring to FIG. 2, a trench 17 having a bottom and side surfaces is formed in substrate 14. The depth of trench 17 is preferably approximately 4 microns to 12 microns. Photoresist 16 is then removed using a conventional method. Referring to FIG. 3, an interlevel dielectric ("ILD") layer 18 is deposited over transistor 8, substrate 14, and the bottom and side surfaces of trench 17. ILD layer 18 may be composed of undoped tetraethyl orthosilicate ("TEOS"), borophosphosilicate glass ("BPSG") and plasma enhanced tetraethyl orthosilicate ("PETEOS"). Alternatively, ILD layer 18 may be composed of plasma enhanced silane oxide.

Figure 4:
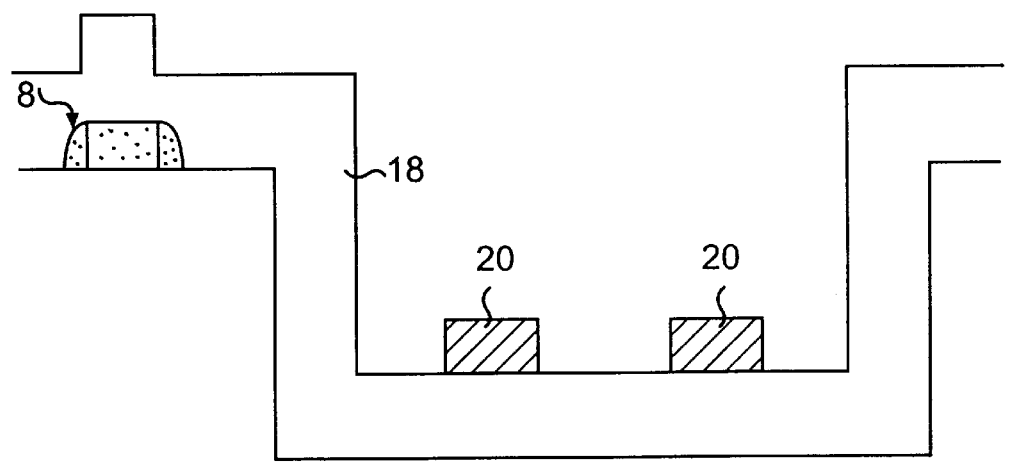

FIG. 4 shows a first metallization process to form the first layer of a substantially recessed inductor coil. A layer of metal, composed of a conventional metallic material, such as copper, for forming contacts in a metallization process is deposited in trench 17. The deposited metal layer is masked and patterned to define a plurality of portions. Referring to FIG. 4, the patterned and defined metal is etched to form a plurality of first metal portions 20. The thickness of first metal portions 20 is preferably approximately 5 microns to 20 microns.

Figure 5:
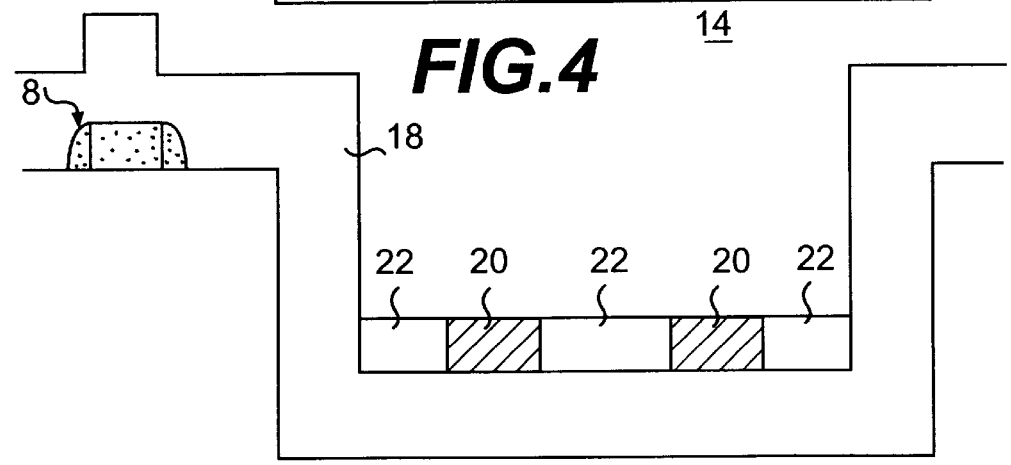

The method of the present invention continues by filling the gaps between first metal portions 20 created by the etching process with a flowable dielectric material. A flowable dielectric material is advantageous to fill the gaps to form a substantially planar layer of metal-dielectric without planarization. The gap-filling dielectric material should be a suitable intermetal dielectric ("IMD"), for example, flowable oxide, silane oxide, and spin-on glass ("SOG"). Referring to FIG. 5, first IMD portions 22 are form by providing a flowable dielectric material into the gaps between first metal portions 20 and between first metal portions 20 and side surfaces of trench 17. In the case of SOG, it is applied in liquid form and exhibits planarization capabilities to provide a substantially planar layer within trench 17. SOG is generally composed of siloxanes or silicates mixed in alcohol-based solvents. The layer of first metal portions 20 and first IMD portions 22 may be further planarized through partial etchback.

Figure 6:
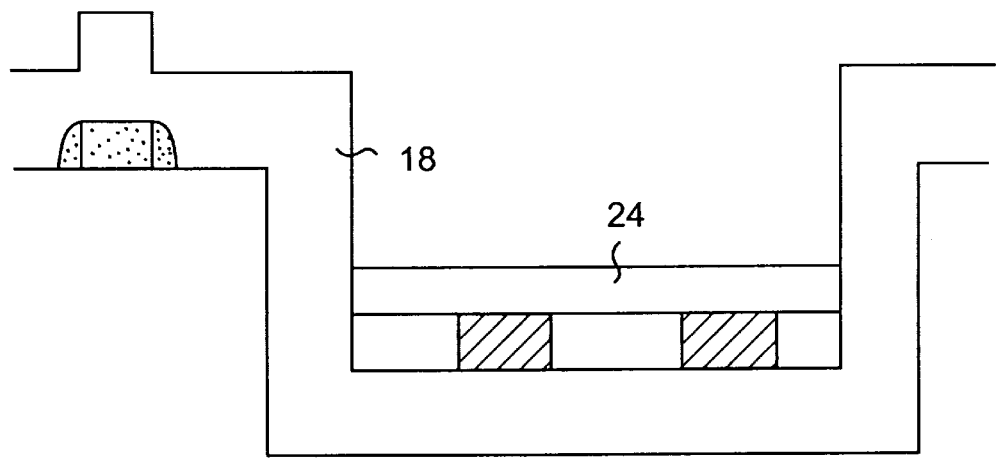
Figure 7:
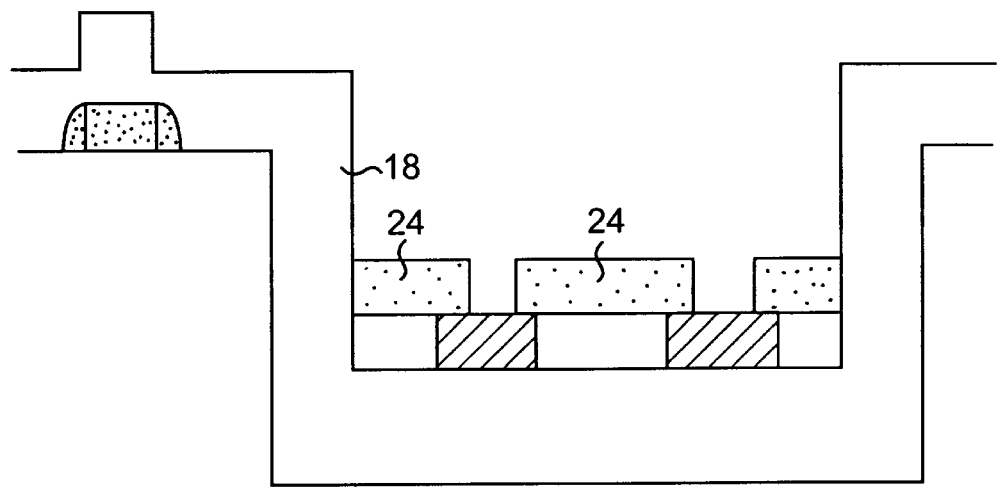

Referring to FIG. 6, a layer of dielectric material 24 is formed over the layer of first metal portions 20 and first IMD portions 22. In a preferred embodiment, a layer of oxide such as a plasma enhanced oxide is deposited to form layer 24. The thickness of first dielectric layer 24 may be approximately 5 microns to 10 microns. As shown in FIG. 7, a plurality of openings, or vias, are formed in first dielectric layer 24. The plurality of openings will later be filled with a metal to form plugs, or interconnects, that provide electrical connection between different layers of the inductor coil. The plurality of openings are formed by providing a photoresist (not shown) over first dielectric layer 24 to pattern and define the openings. First dielectric layer 24 is then etched to form the openings. Because the purpose of the plugs is to provide electrical contact between different layers of metal, each of the openings must align with one of first metal portions 20. In addition, first dielectric layer 24 must be sufficiently etched such that the later-formed plugs may establish electrical contact with first metal portions 20.

Figure 8:
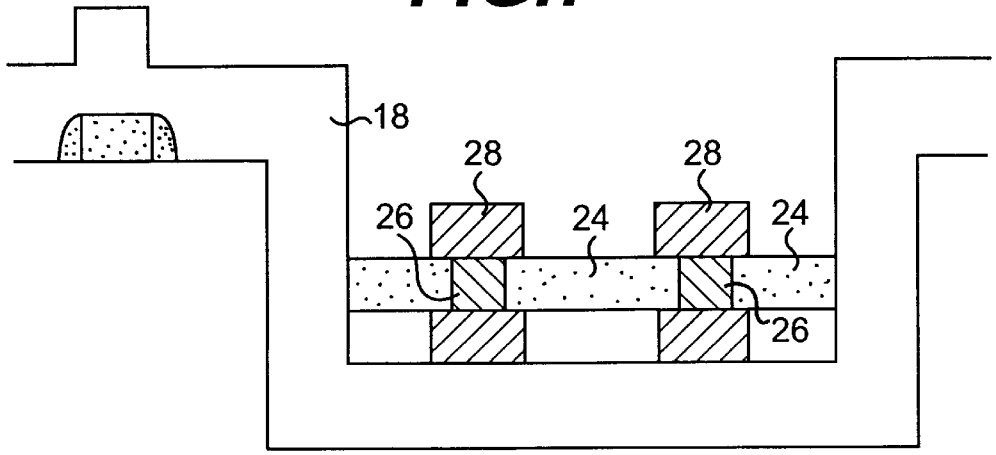

Referring to FIG. 8, after removing the photoresist, the openings in first dielectric layer 24 are filled by depositing a known metal suitable to form a plurality of plugs 26. Plugs 26 may be composed of, for example, tungsten (W), aluminum (Al), or copper (Cu). The process of the present invention continues by forming a second layer of inductor coil, which includes a plurality of second metal portions 28. Second metal portions 28 may be formed by repeating the same process for forming first metal portions 20. Each of second metal portions 28 must be aligned with one of plugs 26, and its thickness is preferably approximately 5 microns to 20 microns. Plugs 26 electrically connect first metal portions 20 and second metal portions 28.

Figure 9:
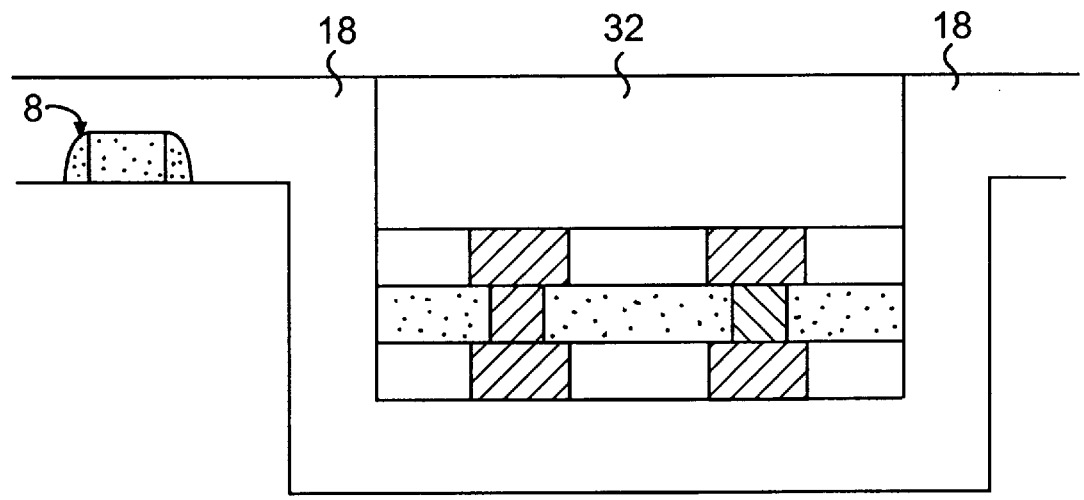

Referring to FIG. 9, second IMD portions 30 are formed among second metal portions 28 is formed by repeating the process for forming first IMD portions 22 to form a substantially planar layer of second metal portions 28 and second IMD portions 30. The layer of second metal portions 28 and second IMD portions 30 may be further planarized through partial etchback. Similarly, by repeating the process for forming first dielectric layer 24, a second dielectric layer 32 is formed over the layer of second metal portions 28 and second IMD portions 30. Second dielectric layer 32 fills trench 17. CMP is performed to planarize the top surfaces of ILD layer 18 and second dielectric layer 32. In a preferred embodiment, ILD layer 18 thickness of approximately 4 microns to 5 microns remains over gate 10 of transistor 8.

Figure 10:
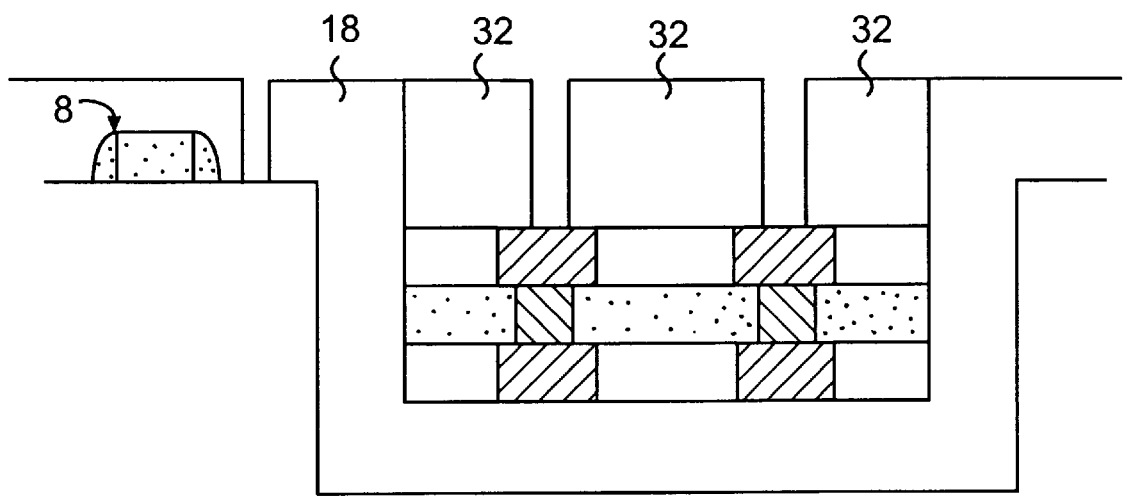
Figure 11:
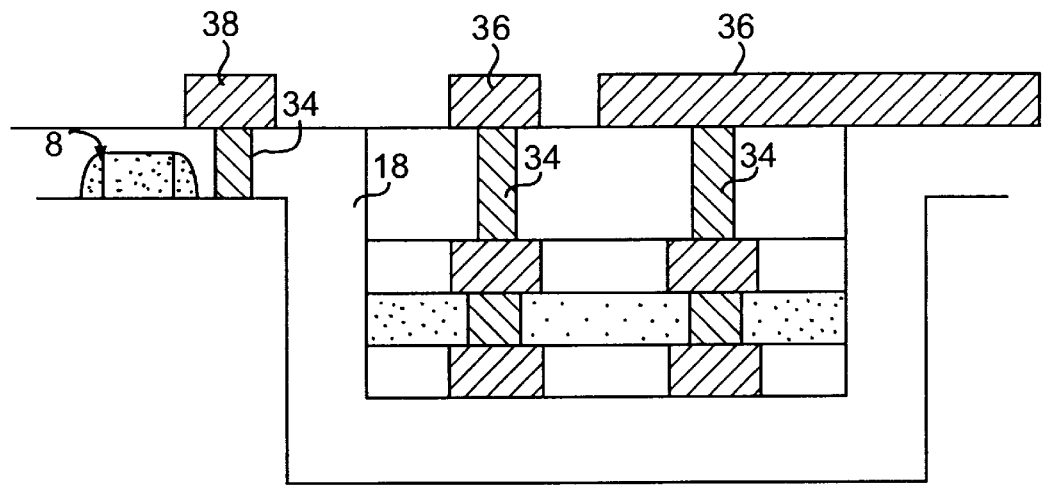

Referring to FIGS. 10–13, the processes already discussed are repeated to form additional plugs to connect additional layers of the inductor coil and a metal contact for transistor 8. Referring to FIG. 10, in addition to a plurality of openings that align with second metal portions 28, an additional opening is formed to provide a contact with one of the spaced-apart regions of transistor 8. Referring to FIG. 11, a plurality of plugs 34 are formed to provide electrical contact with second metal portions 28 and one of the spaced-apart regions of transistor 8. Formed over and aligned with plugs 34 are additional layers 36 of the inductor coil and a contact 38 for one of the spaced apart regions of transistor 8.

Figure 12:
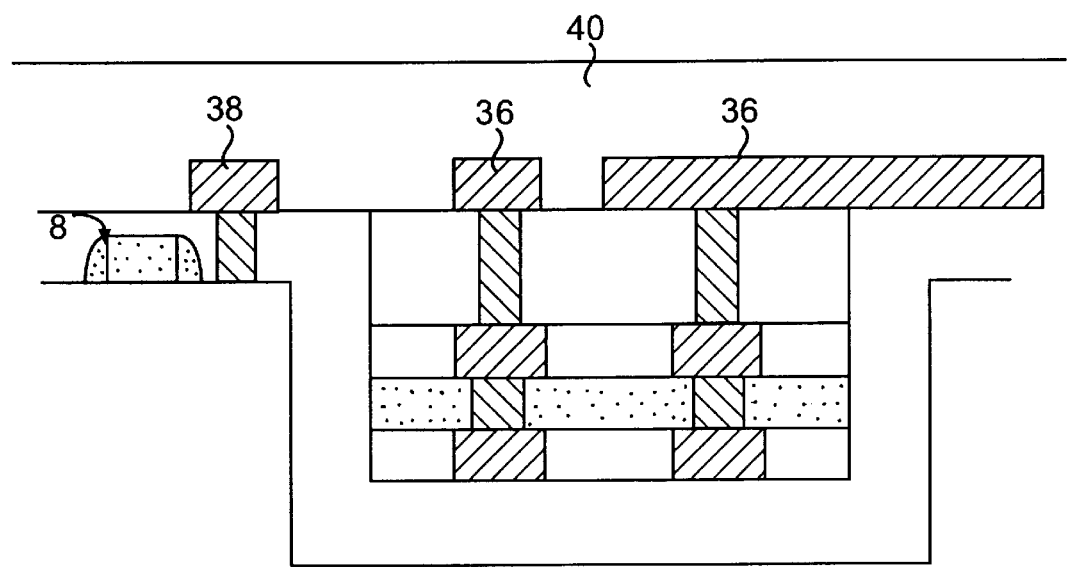
Figure 13:
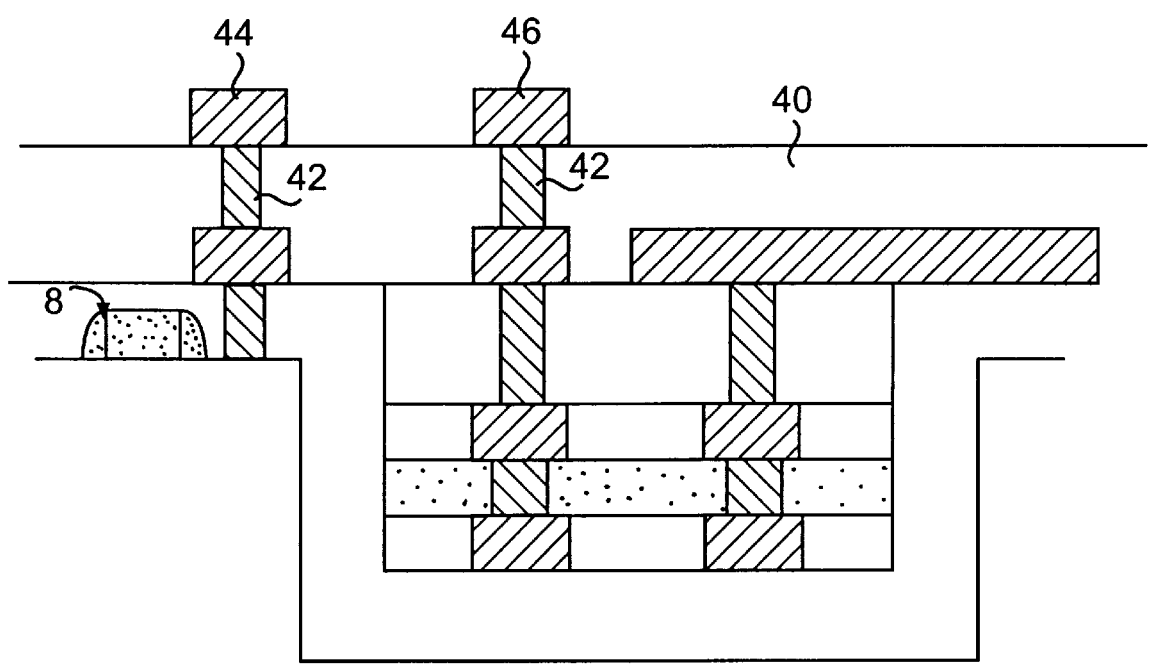

Referring to FIG. 12, a third layer of dielectric material 40 is deposited over ILD 18, contact 38, layers 36, and second dielectric layer 32. Dielectric layer 40 may be composed of flowable oxides, or high density plasma enhanced oxides, and may be deposited by sub-atmospheric chemical vapor deposition ("SACVD"). Layer 40 is then planarized through CMP. Referring to FIG. 13, plugs 42 formed using the process already described to form plugs 26, and an inductor contact 46 and transistor contact 44 are formed using the process described to form first metal portions 20. Each of plugs 42 is aligned with inductor contact 46 and transistor contact 44 to provide electrical connection with layers 36 and contact 38, respectively.

Although FIGS. 10 through 13 only show the formation of contacts for one of the spaced-apart regions of transistor 8, these figures are for illustrative purposes only and should not be construed to limit the application of the present invention. Likewise, three layers of inductor were shown, but greater or fewer could be provided. As discussed above, layers of the inductor are formed without using a CMP process. In addition, two metal portions 20 are shown, but greater or fewer portions may be provided.

It will also be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for forming an inductor in a semiconductor substrate having a trench therein, comprising the steps of:

forming a first metal portion in the trench;

providing a flowable dielectric material in the trench to fill a space between said first metal portion and a wall of the trench to form a layer of said first metal portion and said flowable dielectric material that is substantially planar;

depositing a layer of dielectric material over said layer of first metal portion and flowable dielectric material;

forming a plug in said layer of dielectric material, said plug being in electrical contact with said first metal portion; and forming a second metal portion over said layer of dielectric material wherein said second metal portion is in electrical contact with said plug.

2. The method as claimed in claim 1 wherein said step of forming a first metal portion comprises the steps of:

depositing a layer of metal in the trench;

patterning and defining said layer of metal; and etching said layer of metal to form said first metal portion.

3. The method as claimed in claim 1 wherein said step of providing a flowable dielectric material comprises a step of providing a spin-on glass.

4. The method as claimed in claim 1 further comprising a step of etching back said layer of first metal portion and flowable dielectric material.

5. The method as claimed in claim 1 wherein said step of depositing a dielectric material comprises a step of depositing a plasma enhanced silane oxide.

6. The method as claimed in claim 1 wherein said step of forming a plug comprises the steps of:

patterning and defining said layer of dielectric material;

etching said layer of dielectric material to define an opening wherein said opening is aligned with said first metal portion; and providing a metallic material in said opening.

7. The method as claimed in claim 6 wherein said step of providing a metallic material includes a step of providing tungsten, aluminum, or copper.

8. The method as claimed in claim 1 wherein said step of forming a second metal portion comprises the steps of:

depositing a layer of metal in the trench;

patterning and defining said layer of metal; and etching said layer of metal to form said second metal portion.

9. A method as claimed in claim 1 further comprising the steps of:

depositing a second layer of dielectric material over said second metal portion and said layer of dielectric material; and planarizing said second layer of dielectric material with chemical-mechanical polishing.

10. A method for forming an inductor in a substrate of a semiconductor device including at least one active device, comprising the steps of:

forming a trench in the substrate;

forming a first layer of dielectric material over the substrate and inside said trench;

forming a plurality of first metal portions in said trench;

providing a flowable dielectric material in said trench to fill spaces among said plurality of first metal portions to form a layer of said first metal portions and said flowable dielectric material that is substantially planar;

depositing a second layer of dielectric material over said layer of first metal portions and flowable dielectric material;

forming a plurality of plugs in said second layer of dielectric material, each of said plurality of plugs being in electrical contact with one of said plurality of first metal portions; and forming a plurality of second metal portions over said second layer of dielectric material wherein each of said plurality of second metal portions is in electrical contact with one of said plugs.

11. The method as claimed in claim 10 wherein said step of forming a trench comprises the steps of:

depositing a layer of photoresist over the substrate;

patterning and defining said photoresist;

etching the substrate to form a trench; and removing said photoresist.

12. The method as claimed in claim 10 where said step of forming a first layer of dielectric material includes a step of depositing a layer comprising undoped tetraethyl orthosilicate, borophosphosilicate glass and plasma enhanced tetraethyl orthosilicate or a layer of plasma enhanced silane oxide.

13. The method as claimed in claim 10 wherein said step of forming a plurality of first metal portions comprises the steps of:

depositing a layer of metal in said trench;

patterning and defining said layer of metal; and etching said layer of metal to form said plurality of first metal portions.

14. The method as claimed in claim 10 wherein said step of providing a flowable dielectric material comprises a step of providing a spin-on glass.

15. The method as claimed in claim 10 further comprising a step of etching back said layer of first metal portions and flowable dielectric material.

16. The method as claimed in claim 10 wherein said step of depositing a second dielectric material comprises a step of depositing a plasma enhanced oxide.

17. The method as claimed in claim 10 wherein said step of forming a plurality of plugs comprises the steps of:

patterning and defining said second layer of dielectric material;

etching said second layer of dielectric material to define a plurality of openings wherein each of said openings is aligned with one of said plurality of first metal portions; and providing a metallic material in said plurality of openings.

18. The method as claimed in claim 17 wherein said step of providing a metallic material includes a step of providing tungsten, aluminum, or copper.

19. The method as claimed in claim 10 further comprising the steps of:

providing said flowable dielectric material in said trench to fill the spaces among said plurality of second metal portions to form a layer of second metal portions and flowable dielectric material;

depositing a third layer of dielectric material over said layer of second metal portions and flowable dielectric material;

forming a plurality of plugs in said third layer of dielectric material, each of said plurality of plugs in said third layer of dielectric material being in electrical contact with one of said plurality of second metal portions; and forming a plurality of third metal portions over said third layer of dielectric material wherein each of said plurality of third metal portions is in electrical contact with one of said plugs.

20. A method as claimed in claim 10 further comprising the steps of:

depositing a third layer of dielectric material over said second plurality of metal portions and said second layer of dielectric material; and planarizing said third layer of dielectric material with chemical-mechanical polishing.

* * * * *